(12) United States Patent
Fliess et al.

(10) Patent No.: US 11,389,821 B2
(45) Date of Patent: Jul. 19, 2022

(54) DOSING SYSTEM HAVING A PIEZOCERAMIC ACTUATOR

(71) Applicant: VERMES MICRODISPENSING GMBH, Otterfing (DE)

(72) Inventors: Mario Fliess, Munich (DE); Jürgen Städtler, Feldkirchen-Westerham (DE)

(73) Assignee: VERMES MICRODISPENSING GMBH, Otterfing (DE)

( * ) Notice: Subject to any disclaimer, the term of this patent is extended or adjusted under 35 U.S.C. 154(b) by 0 days.

(21) Appl. No.: 17/043,073

(22) PCT Filed: Mar. 29, 2019

(86) PCT No.: PCT/EP2019/058103
§ 371 (c)(1),
(2) Date: Sep. 29, 2020

(87) PCT Pub. No.: WO2019/197181
PCT Pub. Date: Oct. 17, 2019

(65) Prior Publication Data
US 2021/0023585 A1    Jan. 28, 2021

(30) Foreign Application Priority Data

Apr. 9, 2018  (DE) .................... 10 2018 108 360.2

(51) Int. Cl.
*B05C 11/10*  (2006.01)
*B05C 5/02*   (2006.01)
*H01L 41/053* (2006.01)

(52) U.S. Cl.
CPC ........ *B05C 11/1034* (2013.01); *B05C 5/0225* (2013.01); *H01L 41/0533* (2013.01)

(58) Field of Classification Search
CPC ... B05C 11/1034; B05C 5/0225; B05B 1/083; H01L 41/0533; H01L 41/0536; H01L 41/04
See application file for complete search history.

(56) References Cited

U.S. PATENT DOCUMENTS

| | | | |
|---|---|---|---|
| 6,208,026 | B1 | 3/2001 | Bindig et al. |
| 6,943,482 | B2 | 9/2005 | Bindig et al. |
| 8,201,543 | B2 | 6/2012 | Morris et al. |
| 9,904,298 | B2 | 2/2018 | Fliess et al. |
| 10,090,453 | B2 | 10/2018 | Conner et al. |
| 10,160,025 | B2 | 12/2018 | Roscher et al. |
| 2004/0021767 | A1 | 11/2004 | Bindig et al. |

(Continued)

FOREIGN PATENT DOCUMENTS

| | | |
|---|---|---|
| CN | 102422010 A | 4/2012 |
| CN | 106166531 A | 11/2016 |

(Continued)

OTHER PUBLICATIONS

International Search Report issued in PCT/EP2019/058103; dated Jul. 17, 2019.

*Primary Examiner* — Vishal Pancholi
(74) *Attorney, Agent, or Firm* — Studebaker & Brackett PC

(57) ABSTRACT

The invention relates to a metering system (1) for a metering substance, comprising a nozzle (40), a feed channel (44) for the metering substance, a discharge element (31), and a piezo actuator (61) which is coupled to the discharge element (31) and/or the nozzle (40). The piezo actuator (61) of the metering system (1) is hermetically encapsulated in a housing (62).

18 Claims, 4 Drawing Sheets

(56) References Cited

U.S. PATENT DOCUMENTS

Figure 1:
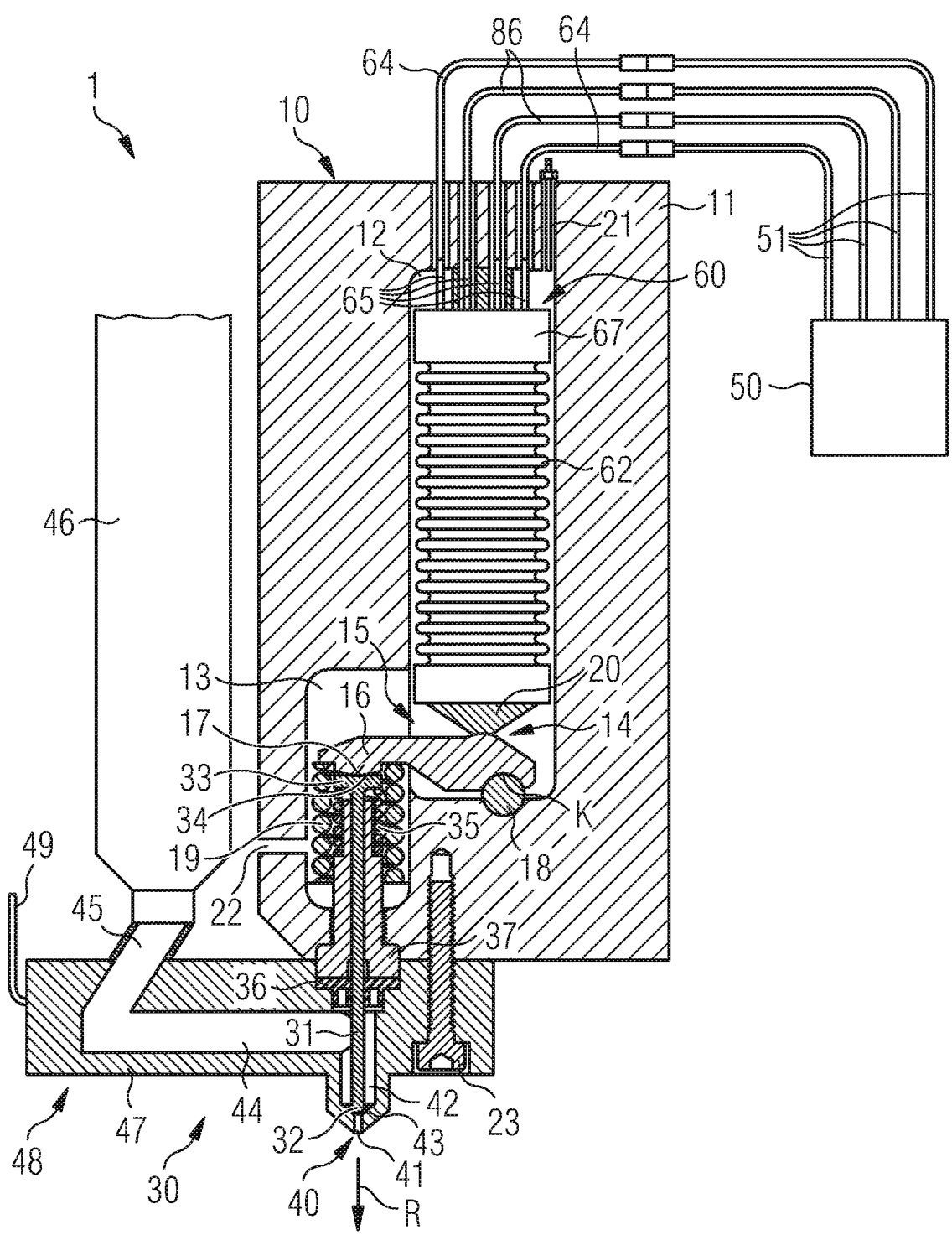

| | | |
|---|---|---|
| 2005/0103587 A1 | 5/2005 | Fischer et al. |
| 2008/0223953 A1 | 9/2008 | Tomono et al. |
| 2015/0300748 A1 | 10/2015 | Hong et al. |
| 2016/0004257 A1 | 1/2016 | Fliess et al. |

FOREIGN PATENT DOCUMENTS

| | | |
|---|---|---|
| DE | 199 40 055 C1 | 4/2001 |
| DE | 100 54 017 A1 | 5/2002 |
| DE | 10 2004 004 736 A1 | 8/2005 |
| DE | 10 2005 057 950 A1 | 6/2007 |
| DE | 10 2008 007 202 A1 | 8/2009 |
| DE | 10 2012 018 606 A1 | 3/2014 |
| EP | 0 844 678 A1 | 5/1998 |
| EP | 1 419 539 B1 | 6/2006 |
| EP | 2 672 094 A1 | 12/2013 |
| EP | 2 969 248 B1 | 2/2017 |
| WO | 2009/095128 A1 | 8/2009 |

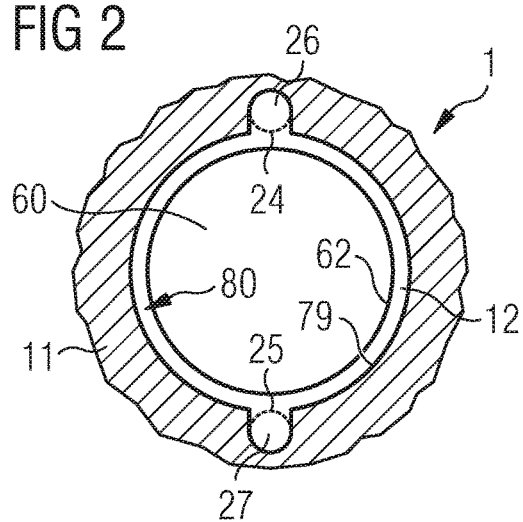
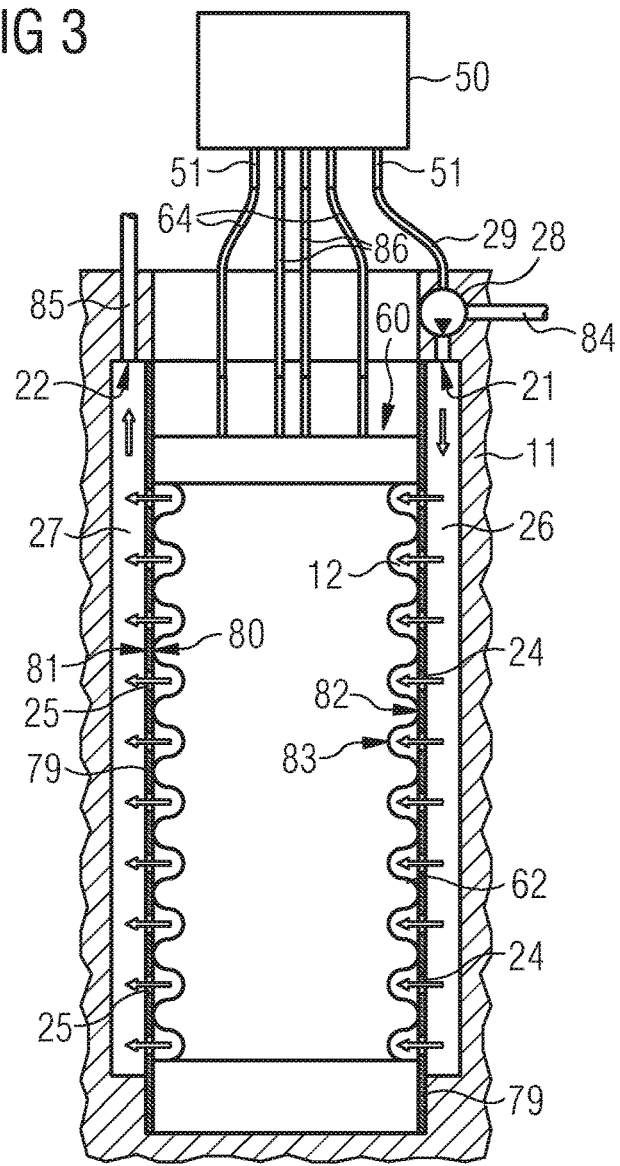

DOSING SYSTEM HAVING A PIEZOCERAMIC ACTUATOR

The invention relates to a dosing system for a metering substance, comprising a nozzle, a feed channel for the metering substance, a discharge element and a piezo actuator coupled to the discharge element and/or the nozzle. Furthermore, the invention relates to the use of a piezo actuator in a dosing system for metering a metering substance and to a method for operating or producing such a metering system.

In general, metering systems are used in various applications to dose a medium to be dosed, typically a liquid to viscous metering substance, in a targeted manner. Within the context of so-called "micrometering technology" it is often necessary to apply very small amounts of the medium to the target surface with point precision and without contact, i.e. without direct contact between the metering system and a target surface. Such a contactless method is often referred to as a "jet method". A typical example of this is the metering of adhesive dots, solder pastes etc. when assembling circuit boards or other electronic elements, or the application of converter materials for LEDs.

An important requirement here is to transport the metering substances to the target surface with high precision, i.e. at the right time, to the right place and in an exactly dosed amount. This can be carried out, for example, by a drop-by-drop delivery of the metering substance via a nozzle of the metering system. The medium only comes into contact with an interior of the nozzle and with a, usually frontal, region of a discharge element of the dosing system. A preferred method here is the discharge of individual droplets in a kind of "ink-jet" process, as is also used in inkjet printers, among other devices. The size of the droplets or the amount of the medium per droplet can be determined in advance as precisely as possible by the structure and control method as well as by the resulting action of the nozzle. Alternatively, the metering substance can also be sprayed in a jet or sprayed onto the target surface in the form of a mist.

A movable discharge element can be arranged in the nozzle of the metering system to deliver the medium from the metering system. The discharge element can be pushed forward inside the nozzle at a relatively high speed in the direction of a nozzle opening or outlet opening, causing a drop of the medium to be discharged, and then retracted.

Alternatively, the nozzle of the dosing system itself can be moved in a discharge or retraction direction. To deliver the metering material, the nozzle and a discharge element arranged inside the nozzle are moved towards each other or away from each other in a relative movement. The relative movement can either be carried out by a movement of the outlet opening or the nozzle alone, or else at least in some cases by a corresponding movement of the discharge element.

In addition, the discharge element can usually be placed in a locked position by having it firmly connected to a sealing seat of the nozzle opening in the nozzle and temporarily remaining there. In the case of more viscous metering substances it may also be sufficient for the discharge element to simply remain in the retracted position, i.e. away from the sealing seat, without a drop of the medium escaping.

Since the basic structure of the different types of metering systems with piezo actuators and their underlying operating principles are generally known, this is not discussed in detail here.

Irrespective of the specific discharge or functional principle of the metering system, a change of position of the discharge element and the nozzle or the outlet opening relative to each other is therefore always performed for metering the metering substance. The necessary movement of the discharge element and/or the outlet opening is usually carried out with the aid of an actuator system of the metering system. Such an actuator system can be implemented in various ways, but in particular in applications requiring a high-precision metering resolution, metering systems with piezo actuators are preferred. Piezo actuators, also referred to as piezoelectrically operated actuators, have the advantage of highly precise and above all faster controllability compared to other types of actuators or actuators operating according to other principles. Piezo actuators are advantageously characterized by extremely short reaction and response times. Thus, the possible response time of a piezoelectric actuator with a typical value of less than 0.1 ms is significantly lower than the corresponding values for other actuator principles. Another advantage is that piezo actuators take up comparatively little space within a metering system compared to other types of actuators. Piezo actuators thus represent an efficient solution for the operation of metering systems, particularly where superfine metering is required.

Despite these advantages, the reliability of piezo actuators in metering systems has often proved inadequate in the past. Due to a high electrical field strength which is applied to a surface of the piezoelectric actuator during the operation of the metering system, polar molecules, e.g. water molecules, are attracted from the air surrounding the actuator or metering system, and these give rise to an increased conductivity at the actuator surface, particularly in the case of ceramic piezo actuators. As a result of the increasing leakage current, the piezo actuator may need to be replaced after a short period of use, which puts the entire metering system out of service for a certain period of time. This unnecessarily reduces the efficiency of the metering system.

It is therefore an object of the present invention to provide a dosing system with a piezoelectric actuator, a use of a piezoelectric actuator in a metering system, and a respective method for operating or producing a metering system with a piezoelectric actuator with which the disadvantages described above can be avoided.

This object is achieved by a dosing system according to claim 1, a use of a piezo actuator in a metering system according to claim 13, and by a method for operating a metering system according to claim 14 and a method for producing a metering system according to claim 15.

A metering system according to the invention for a liquid to viscous metering substance comprises at least one nozzle, a feed channel for a metering substance, a discharge element and at least one piezo actuator coupled to the discharge element and/or the nozzle in order to move the discharge element and/or the nozzle relative to each other. The substance to be dosed passes through a feed channel of the metering system into a section of the metering system comprising the nozzle.

The metering substance can be delivered from the metering system according to the invention according to one of the methods described above, i.e. the metering system is not limited to a specific discharge principle or operating principle. Accordingly, as is usually the case, a discharge element which is movable at relatively high speed can be arranged in the nozzle of the metering system (particularly in the region of the nozzle, e.g. slightly before the outlet opening) to discharge the metering material from the nozzle. Alternatively or additionally, as mentioned above, an outlet opening of the metering system according to the invention can be designed to be movable. The outlet opening designates an opening (which can also be a—usually very short—channel) belonging to the nozzle of the dosing system, which leads from the inside of the metering system to the outside for delivering the metering substance from the metering system. In order to move the outlet opening, at least some regions or a component of the nozzle which comprise the outlet opening, can be designed to be movable relative to other stationary parts of the metering system in a direction of discharge and/or retraction.

In the metering system according to the invention the metering substance is discharged from the nozzle by the discharge element itself. To discharge the substance from the nozzle, the discharge element comes into contact with the metering substance to be delivered and "presses" or "pushes" the metering substance out of the nozzle of the metering system due to a movement of the discharge element and/or the nozzle. By means of the discharge element, the metering substance is in a sense "actively" ejected from the nozzle. This makes the metering system according to the invention different from other dispenser systems, in which a movement of a closure element only causes the nozzle to open, the pressurized metering substance then being released from the nozzle by itself. This is the case, for example, with injection valves of internal combustion engines.

Depending on the specific (previously described) design of the dosing system according to the invention, the movement of the discharge element and/or the outlet opening is effected by a respective coupling of the discharge element and/or the outlet opening (i.e. the component having the outlet opening) to at least one piezo actuator of the metering system.

In principle, the coupling is carried out independently of the specific discharge principle of the metering system according to the invention, in such a way that the forces and movements exerted by the piezo actuator are transmitted in such a way that it results in the desired movement of the respective movable elements of the metering system, i.e. the discharge element and/or the outlet opening, to deliver the metering substance through the nozzle. The at least one piezo actuator is designed and arranged in such a way that it can move the respective movable elements of the metering system directly and/or indirectly, for example by means of a movement mechanism.

Preferably, the motion mechanism can comprise a coupling element to transmit the movements of the piezo actuator to a movable element of the metering system. The coupling element can particularly preferably have a translation element in order to increase a deflection of the piezoelectric actuator by a specific value or factor. In particular, the translation element can be designed to generate a specific translation ratio between a deflection or stroke of the piezo actuator and a resulting movement or stroke of a movable element of the metering system. The translation element can be used to translate a deflection of the piezo actuator into a specific, desired deflection of the movable element of the metering system.

Due in particular to such a translation element, the dosing system is also particularly suitable for the metering of metering substances with a medium to high viscosity of, e.g., up to 0.5 Pa*s, preferably of up to 1 Pa*s, particularly preferably of up to 1000 Pa*s.

The translation element can include, for example, a lever mounted such that it can be tilted, which is in effective contact with the piezo actuator and a movable discharge element of the metering system, e.g. a plunger. This means that a lever arm of the lever is designed to generate a specific translation/stroke ratio.

According to the invention, the at least one piezo actuator of the metering system is encapsulated in a hermetically sealed manner in a housing. Preferably, a monolithic piezoceramic actuator, in particular a piezoceramic multi-layer actuator, or a monolithic piezoelectrically operated multi-layer actuator, may be arranged in a hermetically sealed cover. The housing with the piezo actuator arranged therein, in addition to any other elements assigned to the housing, is hereafter referred to as the actuator unit.

For the purposes of the invention, a "hermetically sealed encapsulation" means that the housing surrounding the piezoceramic actuator is so tightly sealed that no materials or substances can penetrate the housing from the outside. Conversely, this also means that no materials can escape from an interior of the housing to the outside. In particular, the housing is designed in such a way that it is impermeable to water, or moisture in general.

The housing is preferably designed to maintain an "atmosphere", which is arranged inside the housing and surrounds the piezoceramic actuator, essentially constant for a certain period of time. In particular, a predetermined "atmosphere" can be maintained largely unchanged inside the housing by means of the hermetically sealed housing, even during the operation of the encapsulated piezoceramic actuator in the metering system, i.e. during the operation of the metering system according to the invention. A detailed description of the "atmosphere" as well as that of the housing surrounding the piezoceramic actuator is given elsewhere.

The invention also relates to the use of at least one hermetically sealed piezo actuator encapsulated in a housing in a metering system for metering a liquid to viscous metering substance. The encapsulated piezo actuator is preferably used in a metering system according to the invention described above.

An advantageous feature achieved in the dosing system according to the invention with at least one hermetically encapsulated piezo actuator, or by the use of such a piezo actuator hermetically encapsulated in a housing in a metering system, is that the piezo actuator is almost completely shielded from harmful or adverse external (environmental) effects of the metering system even during the operation of the metering system. Thus, the duration of use, or "longevity", of the piezo actuator in the metering system according to the invention can be increased, so that the frequency of the replacement of defective piezo actuators can be reduced significantly compared to metering systems of conventional design, i.e. without encapsulation of the piezo actuator. Advantageously, the (uninterrupted) duration of use of the metering system according to the invention can also be significantly increased in this way.

By reducing unwanted or unplanned downtimes of the metering system according to the invention, which are inevitably caused by an actuator replacement, the efficiency of the metering system according to the invention can be significantly increased compared to conventional metering systems. Furthermore, it is advantageous that the metering system according to the invention can be used in new areas of application, which are particularly unsuitable for comparable metering systems of conventional design, e.g. in environments with a very high humidity or even under water.

In a method according to the invention for operating a metering system for metering a metering substance, having a piezo actuator hermetically encapsulated in a housing, wherein the metering system preferably corresponds to a metering system according to the invention explained above, the operation of the metering system is particularly preferably controlled as a function of at least one operating parameter of the encapsulated piezo actuator. Preferably, the operating parameter is determined during the ongoing operation of the metering system by means of at least one sensor arranged inside the housing. A (measurement) value underlying the operating parameter can be transferred to a control unit of the metering system, wherein the control unit can be used to control the ongoing operation of the metering system as a function of the measurement value (actual value) in such a way that a specifiable target value of the operating parameter is maintained or reached. In this respect, a control unit for the purposes of the invention also comprises features of a regulation unit.

In a method according to the invention for producing a metering system for metering a metering substance having a piezo actuator, preferably for producing a metering system according to the invention, at least one piezo actuator is hermetically encapsulated in a dedicated actuator housing (actuator housing). The housing of the piezo actuator (actuator housing) is then inserted into a housing (housing block) of the metering system. The piezo actuator together with its actuator housing can be arranged in the housing block of the metering system in such a way that it is enclosed by the housing block on all sides, but it can also be accessible (at least partially) from the outside, e.g. in an open recess of the housing block.

Additional, particularly advantageous designs and refinements of the invention will emerge both from the dependent claims and the following description, wherein the independent claims of one claim category can also be further developed in the same way as the dependent claims and exemplary embodiments of another claim category and, in particular, individual features of different exemplary embodiments or variants can also be combined to form new exemplary embodiments or variants.

In the context of the invention, a component which is defined as a piezo actuator or piezoelectrically operated actuator, in particular a piezoceramic actuator, is one which not only may be composed of a plurality of elements, e.g. a plurality of piezo crystals or layers of a piezoelectrically active material, in particular a ceramic, but which also forms a composite that is controlled as a whole by a control unit, in other words, for example, it has a common electrical connection for controlling the individual elements contained within it.

The encapsulated piezo actuator of the metering system which forms the basis of this invention, apart from the housing, is preferably a monolithic piezoceramic multilayer actuator with a number of stacked layers of a piezoelectrically active material (e.g. lead zirconate-titanate) and conductive internal electrodes arranged between the individual layers. Preferably, the internal electrodes are alternately routed to a surface of the actuator, electrically connected in parallel and combined into two groups which form the two connection terminals of the piezoceramic actuator. The basic structure of unencapsulated piezoceramic actuators is known from EP 0 844 678 A1, for example.

In principle, it would be possible within the context of the invention to hermetically encapsulate a plurality, i.e. two or more of the previously described piezo actuators, in a common housing for use in the metering system according to the invention. However, unless explicitly stated otherwise, for the sake of simplicity the following description assumes that a single piezo actuator, preferably a piezoceramic actuator, is hermetically enclosed in a housing without limiting the invention thereto.

Depending on the specific design of the dosing system according to the invention, it may be preferable that a plurality of individually encapsulated piezoceramic actuators are arranged in a single metering system according to the invention. For this purpose, a first encapsulated piezo actuator and a second encapsulated piezo actuator could be arranged sequentially in such a way that the respective lengths of the two piezo actuators can be almost added together. If the two encapsulated piezo actuators are arranged parallel to each other, the forces exerted by the two piezo actuators at any one moment can essentially be added together.

Alternatively or additionally, in the dosing system according to the invention a plurality of individually encapsulated piezo actuators could be connected and/or aligned such that their movements are opposite, e.g. in the manner of a "push-push arrangement". A metering system that works according to this basic principle, although without encapsulated piezo actuators, is known from EP 2 969 248 B1, so that the above-mentioned document is considered part of this disclosure. Accordingly, according to an embodiment of the metering system according to the invention, either one of the two encapsulated piezo actuators of the metering system can push the outlet opening, or a component of the nozzle which comprises the outlet opening, directly or indirectly in a specified direction. This means that while a first of the two encapsulated piezo actuators expands and pushes the outlet opening in one direction, the second encapsulated piezo actuator contracts, thus freeing up the necessary space for the movement of the outlet opening in the desired direction. To move the outlet opening in the other (opposite) direction, the respective functions of the encapsulated piezo actuators are reversed, i.e. the second piezo actuator expands again and then pushes the outlet opening while the first piezo actuator contracts.

Advantageously, the invention can be used in all common metering systems or those described in the introduction having piezo actuators, i.e. independently of the specific discharge principle. For this reason, in the case of the metering system according to the invention, the movable discharge element and/or the movable outlet opening can each be coupled to a number of encapsulated piezoceramic actuators of the metering system according to the invention, wherein the term "number" is to be understood in such a way that the feature in question can be present once or multiple times.

Nevertheless, for reasons of clarity, the invention is described below—without limitation—on the basis of a dosing system in which the metering material is delivered solely by means of a movable discharge element, wherein the movement of the discharge element is effected by means of only one encapsulated piezo actuator. As explained earlier, the discharge element is preferably designed to close off a nozzle opening essentially completely or to firmly connect it to a sealing seat mounted on the inside of the nozzle opening, so that the metering system is closed off.

As already explained, the movement of the discharge element is effected by means of at least one hermetically encapsulated piezo actuator of the metering system. The housing hermetically enclosing the piezo actuator, i.e. the actuator housing, is preferably designed to be "vibration fatigue-resistant".

For the purpose of the invention, the term "vibration fatigue-resistant" or "fatigue-resistant" is understood to mean that within the typical service lifetime of the piezoelectric actuator itself, which is arranged in the housing, i.e. after a number of vibrations (deflections) which the piezoelectric actuator can normally execute in the operation of the metering system (depending on the design) regardless of the encapsulation, no signs of fatigue occur on the housing itself. The housing is preferably designed in such a way that no failure behaviour occurs in the piezo actuator. In particular, the occurrence of leakage currents on the actuator surface or the increase of such leakage currents beyond a specifiable (tolerable) limit should be prevented sufficiently "permanently". Within the scope of the invention, sufficiently "permanently" means that the previously mentioned advantageous features of the housing are essentially preserved in full within a typical period of deployment or use of the encapsulated piezo actuator in a metering system under the normally encountered conditions. It is assumed, for example, that the deflection of the encapsulated piezo actuator is within the normal range when piezo actuators are used in metering systems. Typically, a deflection of the (expanded) piezo actuator can amount to, for example 1.4% to 1.7% of the resting piezo actuator.

Preferably, the housing is designed in such a way that the housing remains intact on a sufficiently "permanent" basis during the use of the actuator unit in the metering system, i.e. during the operation of the metering system. In other words, fatigue symptoms such as cracks, slits, crevices, fractures or other kinds of leaks in the area of the housing should be prevented under the conditions normally encountered in the operation of the metering system (e.g. with regard to the frequency and magnitude of the deflection, temperature in the metering system, etc.). The housing is preferably designed to form a sufficiently "permanent" and continuously effective hermetic diffusion barrier for materials or substances between an interior of the housing and an exterior surrounding the housing, in particular against moisture, e.g. for the duration of a typical (routine) maintenance interval of the metering system. The housing is preferably designed to be "diffusion-tight". Preferably, the housing is therefore designed in such a way that it is completely intact even after a number of at least $1*10^9$, particularly preferably at least $1*10^{10}$, cycles or deflections of the encapsulated piezo actuator.

A vibration fatigue-resistant housing can advantageously be used to ensure that the dosing system can be operated for a specifiable period of time, e.g. a maintenance cycle of the metering system, predominantly without interruption (at least as far as the function of the piezo actuator is concerned). This can reduce unwanted downtimes of the metering system, thereby increasing the efficiency of the metering system.

In order to achieve vibration fatigue resistance of the housing, the housing can be implemented predominantly by means of a metallic material. Alternatively, individual regions of the housing could also be made of a different, i.e. non-metallic, material. For example, a housing base and/or lid might contain a ceramic base material or be realized by means of a flexible diaphragm. Other materials are also conceivable provided they allow a sufficiently permanent hermetic sealing of the housing, in the sense defined above, even during the operation of the metering system.

Preferably, the housing can be designed, at least in some sections, in the manner of a collapsible metal bellows. For this purpose, the housing can comprise a preferably plane-parallel housing base and an adjacent, elongated base body or housing casing fixedly connected thereto, e.g. a metal tube. A bellows structure can be incorporated into at least some regions of the housing casing. The upper closure of the housing is formed by a housing lid, which is preferably plane-parallel and fixedly connected to the housing lid.

Preferably, an interior space that is formed within the closed housing is dimensioned such that a piezo actuator of the type described above can preferably be arranged entirely between the housing base and the housing lid along its entire longitudinal extension. Preferably, the piezo actuator can be arranged in the interior space of the closed housing in such a way that the respective ends or end regions of the piezo actuator rest directly against the housing base or lid, particularly when the piezo actuator is in a resting, i.e. a non-expanded state. Preferably, at least one end region of the piezo actuator, e.g. an actuator foot, can be fixedly connected to the housing base.

The housing can preferably be designed in such a way that a surface of the piezo actuator arranged in the housing and an inner wall of the housing do not touch each other, at least in the region of the housing casing. In other words, an internal cross-section of the housing casing or the housing, which runs essentially perpendicular to the longitudinal extension of the housing, can preferably be larger than a corresponding cross-section of the piezo actuator located in the housing.

Advantageously, the at least partial design of the housing in the manner of a metallic bellows ensures that the housing is at least partially resilient, thereby reducing the stiffness of the housing. This means that the expansion of the piezo actuator in the housing is as free and unimpeded as possible when a voltage is applied. Advantageously, this can ensure that essentially the entire force generated by the piezo actuator can be used to move the discharge element or nozzle of the metering system. The metering system thus combines the advantages of an encapsulated piezo actuator (e.g. higher efficiency of the metering system) with the advantages of an unencapsulated piezo actuator (e.g. barely any additional resistance due to the housing).

Piezo actuators can have a temperature-dependent behaviour. This applies equally to the deflection of the piezoelectric actuator under voltage and to the dimensions of the piezoelectric actuator in the resting state. The temperature of the piezo actuator can thus have an immediate impact on the functioning of the metering system and can influence, for example, the movement and/or position of the discharge element in an undesirable way.

To monitor the temperature, therefore, at least one temperature sensor can preferably be located inside or in the interior space of the housing. Alternatively or additionally, at least one temperature sensor can be arranged on or on top of an outer side of the housing facing away from the encapsulated piezo actuator or from the interior of the housing. Purely for the sake of clarity it is assumed in the following that at least one temperature sensor is arranged inside the housing, without limiting the invention thereto.

Preferably, a temperature sensor can be located inside the housing in a region between the actuator and an inner wall of the housing. The inner wall of the housing comprises a respective inner side of the housing base, casing and lid, i.e. all regions or surfaces of the housing that are facing the piezo actuator for encapsulating or forming the interior of the housing. For example, a temperature sensor could be arranged in a middle region between the piezo actuator and the inner wall, or between the housing base and lid, i.e. freely "floating" in the housing. The temperature in the housing can be used to control the operation of the metering system (as a function of this operating parameter), as explained below.

Preferably, at least one temperature sensor can be located on or on top of an outer side of the piezo actuator. Preferably, the temperature sensor can be arranged on the outer side of the actuator in such a way that the temperature sensor is in measurement contact with the outer side of the actuator. The outer side of the actuator is also referred to synonymously as the actuator surface.

The temperature sensor or temperature probe can be arranged on the actuator surface in such a way that the temperature is measured in the immediate vicinity of the actuator surface. Alternatively or additionally, the temperature of the actuator surface itself could also be measured, e.g. as a measurement or indicator of a temperature in the actuator core.

A plurality of temperature sensors can also preferably be arranged in measurement contact with the outer side of the actuator. For example, in order to detect a temperature gradient along the longitudinal extension of the piezo actuator, it is particularly preferable to arrange a plurality of temperature sensors in different areas of the actuator surface. The longitudinal extension is defined as the largest or longest extension of the piezoelectric actuator in one direction.

Preferably, a number of temperature sensors may be arranged in the peripheral (end) regions of the piezo actuator which form the respective outer end of the piezoelectric actuator along its longitudinal extension, and which may be referred to as the foot or head region of the piezo actuator. One or more temperature sensors may also be particularly preferably arranged in a central area of the piezo actuator that is arranged centrally between the two opposite peripheral end regions. The central region in particular can be characterized by a comparatively high temperature. This affects both the actuator surface and the actuator core.

In addition, at least one temperature sensor can be arranged on or on top of the inner wall of the housing. A number of temperature sensors can preferably be arranged in measurement contact with the inner side of the housing casing. For example, temperature sensors could be implemented on one or more convex sections or concave sections of the bellows-shaped housing casing.

In addition or alternatively, a number of temperature sensors could be located in the region of the housing base and/or lid, in particular in the immediate vicinity of a foot or head region of the piezo actuator or a feed-through into the housing to be described below.

The temperature sensors can be particularly preferably arranged in the housing in such a way that the temperature sensors arranged on the inner wall, in particular on the housing casing, and the temperature sensors arranged on the actuator surface are essentially opposite each other or directly facing each other. Advantageously, a temperature gradient between the respective region of the actuator surface and the respective opposite region of the housing or housing casing can thus be determined, in order to derive information about the effectiveness of a cooling device of the metering system, for example.

Preferably, a temperature sensor can also be arranged inside the piezoceramic actuator or in a core (actuator core) of the piezoelectric actuator. In other words, the temperature sensor may be arranged in measurement contact with an interior of the actuator. The actuator core is defined as the central, middle region of the cross-section of the piezoelectric actuator as in a plan view of a transverse section of a piezoelectric actuator. The actuator thus runs continuously along the longitudinal extension of the piezo actuator between the two peripheral ends of the piezo actuator which bound the piezo actuator.

The temperature sensor can be arranged directly in the actuator core, i.e. at a central point of the transverse section of the piezo actuator, or in an (edge) region radially spaced apart from the centre.

According to the above description, a number of temperature sensors may also be arranged inside the piezo actuator in different regions (along the longitudinal extension) of the piezo actuator, e.g. in a foot region of the piezo actuator, in the central region of the piezo actuator and in a head region of the piezo actuator.

A number of temperature sensors can be particularly preferably arranged in the housing in such a way that the respective temperature sensors, which are arranged in multiple regions of the inner wall, the actuator surface and the actuator core, are each located on a common imaginary line. Preferably, these common lines are obtained both in a plan view of a transverse section as well as a longitudinal section of the piezo actuator. A longitudinal section is defined as a section along the longitudinal extension of the piezo actuator.

In principle, the temperature sensors are designed to transfer the measurement values recorded in each case, preferably by means of temperature sensor connection cables, to a control unit of the metering system automatically or without prompting, essentially in real time. The control unit can be used to evaluate, display and/or store the measurements. Depending on the temperature measurements supplied, however, it is particularly preferable to use the control unit to regulate the operation of the metering system, as described below.

Essentially, the hermetic encapsulation of the piezoelectric actuator in the dosing system provides a range of advantages for the operation of the metering system. Although the basic structure of encapsulated piezo actuators is already known, e.g. from EP 1 419 539 B1, it is not known for use in metering systems of the type mentioned above.

Due to the high-precision metering resolution that is usually required by a metering system, due to the high-frequency expansion of the piezo actuator and the associated heat produced—e.g. at a particularly high operating frequency or metering frequency (frequency of the metering substance release or droplets) of the metering systems—the inside of the housing can be heated up very strongly. Under certain circumstances, the heat produced cannot readily be removed from the encapsulated piezo actuator quickly enough. In order to be able to use the advantages of an encapsulated piezo actuator in the metering system even in extreme cases, it is advantageous to protect the piezo actuator from overheating by means of additional measures. It has therefore proved particularly advantageous to continuously monitor the temperature in the critical areas of the actuator, in particular in the actuator core, during the operation of the metering system, in order thus to counteract any imminent overheating of the piezo actuator at an early stage.

For this purpose, at least one temperature reading (operating parameter) from the inside of the housing and/or a region of the outer surface (outside) of the housing, preferably a plurality of temperature readings from different regions of the housing, can be supplied to the control unit as an actual temperature value. Depending on the temperature reading (actual value) supplied, the operation of the metering system can be controlled by means of the control unit in such a way that a specifiable setpoint value of the temperature is reached or not exceeded in this specific region, particularly in the interior of the encapsulated piezo actuator. In order to achieve an active regulation of the temperature (temperature management) in the housing or the encapsulated piezo actuator, the control unit can regulate the cooling capacity of a cooling device of the metering system, as will be discussed later.

Depending on the application area of the dosing system, the control unit could also be used to control the operation of the metering system in such a way that the metering frequency is temporarily reduced, wherein the heat produced by the piezo actuator is reduced by a certain amount.

Alternatively or additionally, depending on the temperature reading, the driving or activation of the encapsulated piezo actuator can be regulated by the control unit in order to compensate for temperature-related changes in the length of the (heated) piezo actuator and thus to obtain the most exact metering substance delivery at all times. By comparing the temperature reading, which preferably corresponds to a temperature in the actuator core, with a predefined correction value (e.g. an actuator-specific, temperature-dependent expansion coefficient), the temperature-related length change of the (heated) piezo actuator can be taken into account by the control unit in the driver circuit, so that, for example, the voltage is reduced or increased accordingly during the period of contact.

In order to achieve the most efficient possible temperature management of the encapsulated piezo actuator, a heat-conducting medium can be arranged in the housing, i.e. in a space between the inner wall of the housing and an outer surface of the encapsulated actuator (actuator surface). The heat-conducting medium is preferably designed to remove or dissipate heat from the actuator surface.

The heat-conducting medium can be particularly preferably designed such that heat is transferred from the actuator surface to an area of the housing by conduction. Alternatively, the heat-conducting medium can be designed to transport heat away from the actuator surface to an area or section of the housing by convection. A particularly preferred method for this is to use a predominantly liquid, heat-conducting medium.

Preferably, the heat-conducting medium can have a temperature or thermal resistance which is higher than temperatures typically occurring on the surface of the piezo actuator during operation of the metering system. Preferably, the heat-conducting medium should be thermally stable at least up to a temperature of 140° C., particularly preferably up to at least 150° C., in particular up to at least 160° C.

In principle, it would also be possible to provide the heat dissipation from the actuator surface in the form of a "heat pipe". Accordingly, a (heat-conducting) medium could be arranged in the hermetically sealed housing (the heat pipe), which medium exists in the housing to a lesser extent in the liquid state and to a greater extent in a vapour-like state. The actuator surface could then represent a corresponding heat transfer surface for a heat source, wherein a specifiable region of the housing could be designed as a heat transfer surface for a heat sink. The design of a preferred "heat sink" in a region of the housing will be discussed in more detail later.

Regardless of the specific design, the heat-conducting medium is preferably implemented as part of an "atmosphere" arranged inside the housing. The composition of the "atmosphere" is preferably such that it produces particularly advantageous conditions in the housing for the operation or the functionality of the encapsulated piezo actuator. In the context of the invention, the "atmosphere" is understood in an extended sense to mean a medium which essentially completely fills the interior space of the housing, wherein the interior space is formed between an outer surface of the piezo actuator, i.e. the actuator surface facing the interior space, and the inner wall of the housing. The atmosphere thus surrounds or encloses the actuator surface almost completely and could therefore also be called an ambient medium. Preferably, the atmosphere may comprise a mixture of different gaseous, liquid and/or solid media.

In order to achieve the most efficient dissipation of heat from the actuator surface, the housing can comprise a preferred defined heat dissipation zone. The heat dissipation zone is preferably thermally coupled to a cooling device of the metering system.

A heat dissipation zone here is understood to mean a region that forms a heat sink to the environment. In other words, the heat dissipation zone represents a heat transfer surface for the heat sink. In addition to an area of an outer surface of the housing, the heat dissipation zone can also comprise the corresponding region of the inner wall of the housing and the areas of the housing in between, e.g. the metal body.

Preferably, the heat dissipation zone is designed to deliver the process heat generated by the piezo actuator via the housing to the outside, i.e. into a section of the metering system surrounding the housing externally. In particular, in interaction with the cooling device of the metering system, the heat dissipation zone can be used to perform regulation of the temperature in the housing, particularly in the actuator core. For example, increased cooling by means of the cooling device can increase the amount of heat dissipated in the heat dissipation zone, so that even more heat can subsequently be removed from the actuator surface.

Preferably, the heat dissipation zone is designed and arranged in or on the housing or as part of the housing in such a way that the most effective removal of heat from the heat dissipation zone by means of the cooling device is achieved. For example, the heat dissipation zone could be implemented by means of a number of cooling fins or other elements for surface area enlargement in a region or section of the housing casing. The heat dissipation zone can therefore be only partially formed, i.e. it can comprise only a limited portion of the housing.

The cooling device interacting with the heat dissipation zone preferably uses a coolant that flows around the housing externally, which can comprise a gaseous and/or liquid medium. At least the heat dissipation zone, possibly also the entire actuator unit, can preferably be immersed in the coolant, wherein the coolant can comprise a mixture of different cooling substances.

Essentially, the coolant is designed to transport the heat away from the heat dissipation zone to a location at a lower temperature. For this purpose, a chamber (actuator chamber) of the metering system surrounding the housing of the piezo actuator can be continuously supplied with an in particular gaseous coolant, e.g. ambient air, so that the coolant can essentially permeate the entire actuator chamber. Compressed air or pressurised air, i.e. ambient air compressed in a conventional way, can be used as a coolant, since compressed air is already available in most installations. The heat dissipation zone or the housing act as a kind of heat exchanger: the heat generated by the piezoelectric actuator and transmitted to the housing, preferably to the heat dissipation zone, is transferred to the coolant or is conducted away from the housing by means of the coolant.

Preferably, the dosing system can comprise at least one feed and/or discharge opening for the coolant. Preferably, starting from the feed opening of the metering system, a coolant-conducting channel, which is also referred to as the inlet channel, can extend predominantly parallel to the actuator unit in the housing of the metering system, which channel comprises in its course a number of essentially rectangular duct-shaped coolant-conducting branches. Each of these branches is routed away from the inlet channel through the housing of the metering system in such a way that the respective branch forms a respective feed opening into the actuator chamber for the coolant, i.e. a single feed opening of the metering system can interact with a plurality of feed openings of the actuator chamber.

Preferably, in order to regulate the cooling capacity of the cooling device (and thus also to regulate a temperature in the housing) the volume of the coolant supplied to the actuator chamber per unit time can be (actively) regulated by means of the control unit, e.g. as a function of a temperature in the housing. For this purpose, a "coolant supply device", e.g. a pump, that can be controlled by the control unit (preferably with a regulation unit) can preferably be arranged at least at the feed opening of the metering system, in order to (actively) regulate the coolant influx into the actuator chamber so that a specifiable temperature setpoint is reached in a specific region of the housing. Alternatively, a quantity of compressed air supplied from a compressor or compressed air reservoir can be regulated by the control unit using a proportional valve.

Preferably, the coolant in the actuator chamber can be directed to the heat dissipation zone of the housing. In a particularly preferred design, a respective feed opening of the actuator chamber is assigned a discharge opening that interacts with it, wherein the feed or discharge openings are positioned relative to each other and to the heat dissipation zone in such a way that the inflowing coolant is forced to flow around at least a portion of the heat dissipation zone on its way from a respective feed opening to the respective discharge opening that interacts with it. Preferably, the individual discharge openings of the actuator chamber can be combined to form a common outlet channel, which can be designed similarly to the inlet channel.

Alternatively, the actuator chamber could contain only a single feed or discharge opening for the coolant, i.e. the feed or discharge opening of the actuator chamber corresponds simultaneously to the feed or discharge opening of the metering system. Preferably, "flow-directing" elements can be arranged in the actuator chamber, e.g. baffles or fans, to direct the inflowing coolant in as direct or targeted manner as possible from a feed opening of the actuator chamber to the heat dissipation zone and then to a discharge opening of the actuator chamber. Alternatively or in addition, the coolant could also be circulated in the actuator chamber for a certain period of time, i.e. without the influx of new coolant into the actuator chamber, provided that sufficient cooling capacity is achieved.

Depending on the composition of the coolant and the conditions prevailing in the coolant or in the housing, in particular with regard to the temperature and the pressure exerted on the coolant, the coolant can also be in predominantly liquid form, or partly liquid and partly gaseous.

Preferably, the cooling device can be designed in such a way that mechanical abrasion debris which collects in the actuator chamber, for example as a result of the expansion movement of the housing or other moving parts, is removed from the actuator chamber by the coolant into an area outside the actuator chamber, preferably outside the metering system.

An efficient temperature management of the encapsulated piezo actuator can advantageously increase the uninterrupted service duration of the metering system significantly. The individual components involved in the temperature management, in particular in combination, form an effective temperature management system and enable the potential overheating of the piezo actuator not only to be detected at an early stage, but advantageously also to be prevented. By means of the temperature management system, in addition to the method that accesses it to operate the metering system, the temperature of the piezo actuator can be kept almost constant during the operation of the metering system in a range which is conducive to the longevity of the piezo actuator.

A further advantage is that the temperature management system can also improve the precision of the metering system. Under certain circumstances, the temperature-dependent expansion behaviour of the encapsulated piezo actuator may have a negative effect on the accuracy of the metering substance delivery of the dosing system, for example if the discharge element can no longer reliably close the nozzle due to a change in length (longitudinal expansion) of the piezo actuator. The temperature management system can be advantageously used to maintain the temperature of the piezo actuator at a specific set point, so that the piezo actuator essentially has a constant length during the operation of the metering system, wherein the precision of the metering system can be significantly increased.

Purely for the sake of completeness, it should be noted that the heat dissipation from the heat dissipation zone, i.e. the cooling of the encapsulated piezo actuator, can also take place at least in part by "natural" convection by means of the air surrounding the actuator unit. In this type of "passive" cooling, therefore, no specific temperature management of the piezo actuator is possible, so that the previously explained active temperature regulation is preferred.

In order to enable the operation of the dosing system as a function of a temperature in the housing within the temperature management scheme, at least one temperature reading should be supplied externally to the control unit. Preferably, the housing therefore comprises at least one feed-through for a number of electrical conductors or conductor tracks. Preferably, the housing comprises at least two separate feed-through openings, more preferably at least three separate feed-throughs, particularly preferably at least four separate feed-throughs, for feeding through each at least one electrical conductor in each case.

The feed-throughs are particularly preferably designed and arranged in such a way that the respective electrical conductor runs in a hermetically sealed and electrically insulated manner between the interior space or internal region of the housing and an exterior or external region of the housing, surrounding the housing.

Preferably, at least two of the electrical conductors are designed for communication with the control unit, i.e. control signals for controlling the encapsulated piezo actuator are transmitted from the control unit to the piezo actuator. For this purpose, the piezoelectric actuator can have two contact points or connection terminals, wherein each terminal is coupled to a group of the internal electrodes of the piezo actuator connected in parallel. Preferably, a respective connection terminal of the piezo actuator is permanently connected, e.g. soldered, to one of the two fed-through electrical conductors. Two additional electrical conductors are preferably designed to contact a number of temperature sensors in the housing or to transmit corresponding temperature readings to the control unit. For example, a single PT100 temperature sensor could be contacted by means of the two fed-through electrical conductors. Alternatively, a plurality of (bus-enabled) temperature measuring ICs or IC temperature sensors could be contacted by means of the two fed-through electrical conductors. If a plurality of PT100 temperature sensors are installed in the housing, each individual one of these temperature sensors could be contacted by means of two separate electrical conductors, i.e. assigned to a respective temperature sensor.

Preferably, the electrical conductors can be implemented by means of electrical connectors or connection pins. Preferably, the respective connector is passed through the housing by means of a glass solder, which is permanently integrated into the housing. Preferably, the respective glass solders or glass feed-throughs can be incorporated into the housing base and/or the housing lid. The electrical connectors and/or conductors are particularly preferably routed from the inside of the housing to the outside in a hermetically sealed and electrically insulated manner by means of glass solder.

It should be noted here that the contacting of the encapsulated piezo actuator or the temperature sensors in the housing by means of the feed-throughs can also be carried out in a different way than that previously explained. For example, at least one temperature sensor could be connected to a contact (connection terminal) of the piezo actuator, so that only three feed-throughs would be required. In addition, an additional feed-through (e.g. for transferring a measurement signal of the temperature sensor) could be saved by applying the potential of the associated electrical conductor to the metallic housing, thus making it accessible externally. It would also be possible, however, for the temperature readings (sensor signals) of at least one temperature sensor to be applied to the connection pins or terminals of the encapsulated piezo actuator and modulated onto them in a suitable manner, as is done, for example, when configuring a "PowerLAN" or "direct LAN" connection. The modulation of the sensor signals could also be carried out in such a way that the temperature readings of a plurality of temperature sensors (e.g. bus-compatible temperature measuring ICs) could be transmitted to the control unit, or the collective temperature readings of a plurality of temperature sensors could be transmitted as a data stream. If the metallic housing was used as a contact element, as mentioned above, the piezo actuator and a number of temperature sensors could then be contacted by means of only a single feed-through. Nevertheless, the following assumes a housing with four separate feed-throughs, without limiting the invention thereto.

Preferably, each fed-through electrical conductor can also comprise a multi-core cable for conducting electrical signals. This also makes it possible to transmit the individual measurements (measurement signals) of a plurality of temperature sensors to the control unit in parallel. For this purpose, a plurality of fine wires could be routed together through a single feed-through, the individual wires being arranged at a suitable distance from each other and encapsulated together with glass solder. A feed-through designed in this way could also be referred to as a multi-core feed-through.

Advantageously, by means of the feed-throughs through the housing of the encapsulated piezo actuator, it can be ensured that the encapsulated piezo actuator is controlled in the same way as a conventional metering system with an unencapsulated piezo actuator, i.e. control units of conventional metering systems can also be used to control the encapsulated piezo actuator. Furthermore, the operation of the metering system can be controlled as a function of a temperature in the housing by means of the temperature measurements that are fed through.

In order to further increase the longevity of the encapsulated piezo actuator, a moisture suppression medium can be arranged inside the housing, i.e. in a region between the inner wall of the housing and the surface of the actuator. Preferably, the humidity suppression is carried out in such a way that any moisture (e. g. water or water vapour) produced is bound and/or converted immediately and essentially completely. Preferably, the moisture-suppressing medium is designed to reliably shield or insulate the actuator surface from contact with moisture. In particular, by means of the moisture-suppressing medium, the amount of "available" water that could theoretically accumulate on the surface of the actuator can be kept below a critical limit for the operation of the piezo actuator for a sufficiently long period, i.e. at least for a typical period of usage of the piezo actuator in the metering system.

To suppress moisture in the housing, the moisture-suppressing medium may contain different liquid and/or solid media which chemically convert or reactively consume moisture. Preferably, the moisture-suppressing medium may comprise at least one water-absorbing or hygroscopic medium, which can be realized, for example, by means of a dry gel or in the form of a molecular sieve. Alternatively or in addition, the moisture-suppressing medium can comprise a water-transporting, electrically insulating medium. Preferably, a liquid water-free and water-conducting insulating medium can be used for this purpose.

Preferably, in addition to the heat-conducting or moisture-suppressing medium, the atmosphere can also include other components that promote the uninterrupted operation of the metering system.

Preferably, the atmosphere of the housing can comprise a pressure compensation zone. The pressure compensation zone, which could also be called the expansion zone, provides a specific volume in the housing to compensate for thermal expansion of the piezo actuator. Preferably, the expansion zone is implemented by means of a gas or gas mixture which has a high compressibility. In principle, the medium that forms the expansion zone can be freely movable in the atmosphere. For example, the atmosphere could comprise a liquid and/or solid moisture-suppressing and/or heat-conducting medium and a gaseous expansion zone, such as a gas bubble. Alternatively, the expansion zone could be arranged in the housing in a closed or enclosed region, separated from the rest of the interior of the housing with an at least partially flexible shell or partition wall, i.e. materially separated from the rest of the atmosphere.

The pressure compensation zone is advantageously designed such that a temperature-related volume change in the piezo actuator that occurs in typical operation of the metering system can be compensated in such a way that a specifiable pressure inside the housing (internal pressure) remains essentially constant even during the operation of the metering system. The arrangement of a defined atmosphere in the housing can thus improve both the uninterrupted operating period and the precision of the metering system.

In order to be able to continuously monitor the internal pressure during operation of the dosing system, at least one pressure sensor for measuring the internal pressure can be installed in the housing. Preferably, at least one pressure measurement can be fed to the control unit as an actual pressure value, in a similar way to that already described for the temperature measurements. The operation of the metering system can also preferably be regulated by means of the control unit as a function of the pressure measurement supplied, in such a way that a specifiable pressure setpoint is not exceeded in the housing. For this purpose, the actual pressure value could be taken into account as part of the temperature management described previously, i.e. a temperature and/or a pressure in the housing can be regulated by means of the temperature management.

In addition to or else as an alternative to the detection options already mentioned, at least one so-called strain gauge may be mounted inside the housing (e.g. in the region of the housing inner wall) and/or on an outer side of the housing for monitoring the absolute length and dynamic length change of the encapsulated piezo actuator or the entire actuator unit. If a strain gauge is arranged in the housing, the corresponding measurement signals can be routed through the housing to the control unit by means of a feed-through described earlier. The signal obtained in this way can provide information about the respective operating state of the piezo actuator or actuator unit, and can therefore also be used for appropriate compensation measures, such as an adjusted coolant flow or a modified control voltage.

Preferably, the housing surrounding the piezoceramic actuator can exert a specifiable mechanical pre-tension on the piezoceramic actuator. As explained above, the (resting) piezo actuator is arranged in the housing in such a way that the two peripheral end regions have direct contact with the housing base or the housing lid. Preferably, the housing can be dimensioned and designed in such a way that it exerts a certain pressure on the (resting) piezo actuator or causes it to become compressed.

This can be advantageously used to ensure that the piezo actuator is already mechanically pre-tensioned in the resting state, which in the case of a dynamic load on the piezoelectric actuator provides increased safety against tensile stresses in the piezoelectric material, further reducing the probability of failure of the metering system. Accordingly, the design of the metering system can be simplified, because the arrangement of components (e.g. actuator spring), which in conventional metering systems are used to return the unencapsulated piezo actuator to its rest state, can be eliminated or at least designed to a weaker standard.

Figure 4:
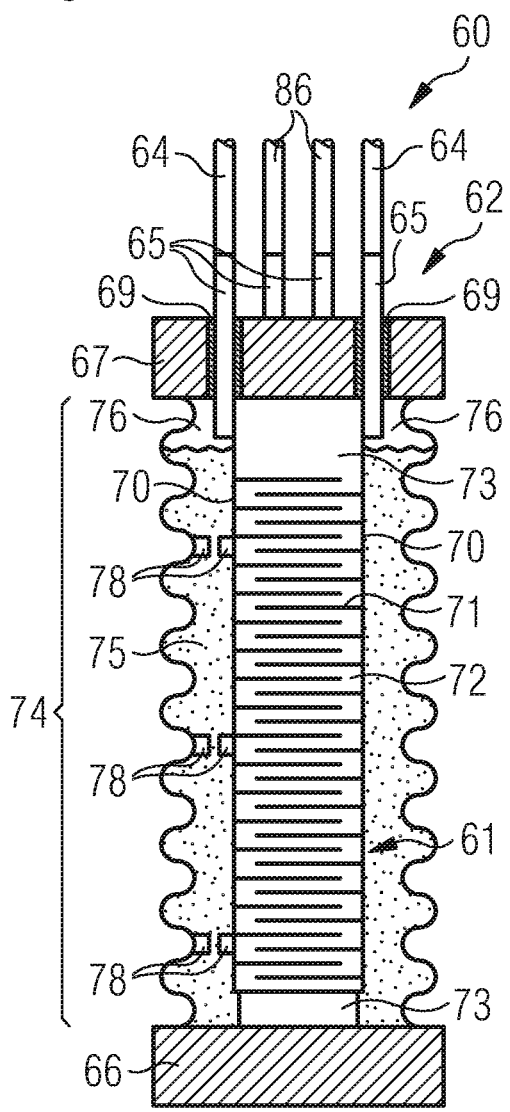
Figure 5:
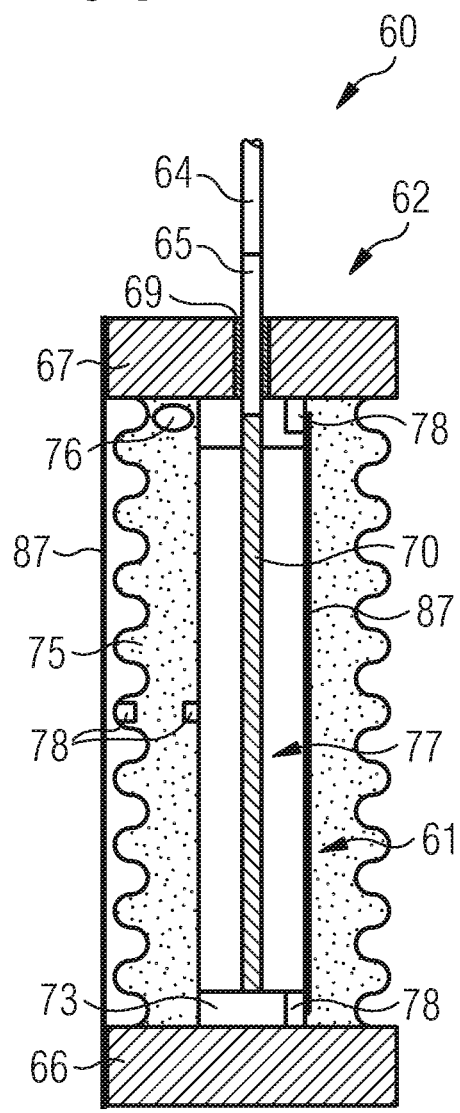
Figure 6:
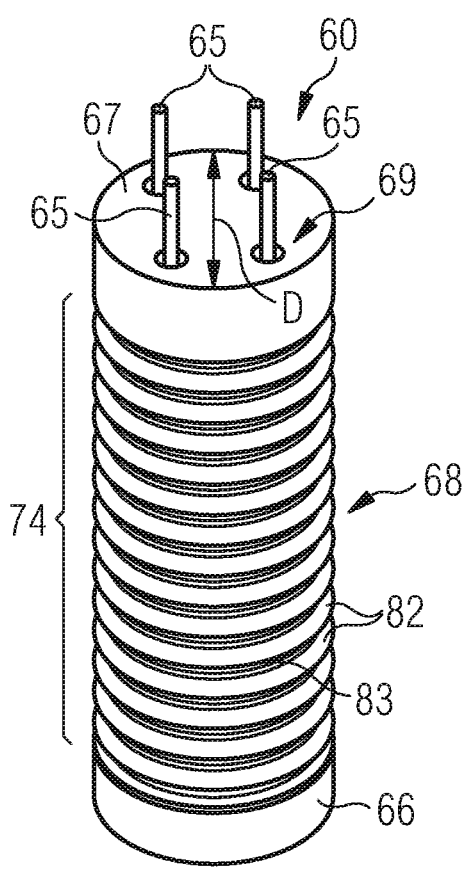

In the following the invention is explained once again in more detail with reference to the attached figures and based on exemplary embodiments. In the different figures the same components are labelled with identical reference numbers. The figures are not normally drawn to scale. Shown are:

FIG. 1 a cross-sectional view of an embodiment of a metering system according to the invention, FIGS. 2 and 3 parts of a different embodiment of a metering system according to the invention shown in cross-section, FIGS. 4 and 5 cross-sectional views of different possible embodiments of actuator units for a metering system according to the invention, FIG. 6 a perspective view of another possible embodiment of an actuator unit for a metering system according to the invention.

Based on FIG. 1, a concrete preferred exemplary embodiment of a metering system 1 according to the invention will now be described. The metering system 1 is shown here in the usual intended orientation or position, e.g. during operation of the metering system 1. A nozzle 40 is located in the lower region of the metering system 1, so that the drops of the medium are ejected downwards through the nozzle 40 in a discharge direction R. Where the terms down and up are used in the following, these terms therefore always refer to such a position, usually the normal one, of the metering system 1. However, this does not exclude the possibility that the metering system 1 can also be used in a different position in specific applications and that the drops are ejected laterally, for example. Depending on the medium, pressure and precise design as well as control of the entire discharge system, this is also entirely possible.

The metering system 1 comprises as essential components an actuator assembly 10 and a fluidic assembly 30. In the exemplary embodiment of the metering system 1 shown here, the actuator assembly 10 and the fluidic assembly 30 are fixedly connected to each other, e.g. by means of a fixing screw 23. It should be noted, however, that the respective assemblies 10, 30 can also be implemented in the manner of plug-in connector parts that can be coupled to each other to form a quick-release coupling. Accordingly, the actuator assembly 10 and the fluidic assembly 30 could be coupled together without tools in order to form the metering system 1.

The actuator assembly 10 essentially comprises all components that provide the drive or the motion of a discharge element 31 in the nozzle 40, i.e. for example, the actuator unit 60, a motion mechanism to be able to actuate the discharge element 31 of the fluidic assembly 30, a control unit 50, to allow control of a piezo actuator 61 and similar components, as will be explained below.

In addition to the nozzle 40 and the feed line 44 of the medium to the nozzle 40, the fluidic assembly 30 comprises all other parts that are directly in contact with the medium, in addition to the elements that are required to assemble the relevant parts that are in contact with the medium or to hold them in position on the fluidic assembly 30.

In the exemplary embodiment of the metering system 1 shown here, the actuator module 10 comprises a housing block 11 with two internal chambers, namely firstly an actuator chamber 12 with an actuator unit 60 located therein having at least one piezoelectric actuator (not visible here) encapsulated in a housing 62, and secondly, an action chamber 13 into which a movable discharge element 31, here a plunger 31, of the fluidic assembly 30 protrudes. By means of a movement mechanism 14, which protrudes into the action chamber 13 from the actuator chamber 12, the plunger 31 is actuated by means of the actuator unit 60 in such a way that the fluidic assembly 30 ejects the medium to be dosed in the desired quantity at the desired time. The plunger 31 here—as will be explained later—closes a nozzle opening 41 and thus also acts as a closure element 31. However, since the majority of the medium is only ejected out of the nozzle opening 41 when the plunger 31 moves in the closing direction, it is referred to here as the discharge element 31.

To control the actuator unit 60, the actuator unit 60 or the piezo actuator arranged in the housing 62 (see FIG. 4) is connected electrically or for signal transmission to a control unit 50 of the metering system 1. The connection to this control unit 50 is made via control cables 51, which are connected at their ends to suitable actuator unit control connections 64, e.g. suitable plug connectors. Unlike as shown in FIG. 1, the control connections 64 can be sealed and routed through the housing 10 in such a way that in the area of the respective fed-through control connections 64, essentially no air can enter the actuator chamber 12 from the outside, e.g. as part of a cooling system of the actuator unit 60 with compressed air as described below. The actuator unit 60, in particular the actuator unit control connections 64, can be equipped, for example, with a suitable memory unit (e.g. an EEPROM or the like), in which information such as an item designation etc. or control parameters for the actuator unit 60 are stored, which can then be read out by the control unit 50 to identify the actuator unit 60 and control it in the appropriate manner. The control cables 51 can comprise a plurality of control lines and data lines. However, since the basic control of piezo actuators is known, this will not be discussed further.

To provide the hermetically sealed and electrically insulated passage of an electrical conductor through the housing 62, the actuator unit 60 comprises four contact pins 65 in a housing cover 67. The contact pins 65 here (as in FIGS. 3 and 4 also) are arranged parallel or in a row for the sake of clarity, wherein the contact pins 65 can also be realized in any other suitable arrangement (see FIG. 6). The two—here external—contact pins 65 are used for controlling the piezo actuator or communication between the piezo actuator and control unit 50. Outside the housing 62, the contact pins 65 are coupled to the control unit 50 via respective actuator unit control connections 64. Inside the housing 62, each contact pin 65 is connected to one of the two connection terminals of the piezo actuator (see FIG. 5). The two contact pins 65 shown here in the centre are used to transmit the measurements of temperature sensors 78 (see FIG. 4) from the housing 62 to the control unit 50. For this purpose, the contact pins 65 are each connected at one end to the control unit 50 by means of temperature sensor connection cables 86 and at the other end (in the housing) to the individual temperature sensors 78, preferably by means of the respective temperature sensor connection cables (not shown here). A detailed description of the contacting of the temperature sensors in the housing will be given at a later date.

The piezo actuator (see FIG. 4) arranged in the housing 62, or the housing 62, can expand and contract again in the longitudinal direction of the actuator chamber 12, according to how it is driven by means of the control device 50. The actuator unit 60 can be inserted into the actuator chamber 12 from above. The upper counter-bearing can then be provided by a ball dome (not shown here) which is height-adjustable by turning a screw, thereby enabling an exact adjustment of the actuator unit 60 relative to a movement mechanism 14, in this case a lever 16. Accordingly, the actuator unit 60 is mounted downwards on the lever 16 via a pressure piece 20, which tapers downwards at an acute angle, and the lever in turn rests on a lever mounting 18 at the lower end of the actuator chamber 12. This lever bearing 18 allows the lever 16 to be tilted about a tilt axis K, so that a lever arm of the lever 16 protrudes into the action chamber 13 through an opening 15. At the end of the lever arm, this has a contact surface 17 facing toward the plunger 31 of the fluidic assembly 30 coupled to the actuator assembly 10, which presses on the contact surface 34 of the plunger head 33. The piezo actuator or the pressure piece 20, on the one hand, and the plunger head 33 or a plunger 31 on the other hand, act on the same side of the lever 16 with respect to the tilt axis K. However, the respective distance between the piezo actuator and the tilt axis K or between the plunger 31 and the tilt axis K is different.

The lever 16, or the movement mechanism 14, represents a translation element in order to amplify a deflection (stroke) of the plunger 31 relative to a stroke of the piezo actuator in a certain ratio. Such a translation element is particularly advantageous for metering medium- or high-viscosity metering substances, wherein the viscosity can be up to 0.5 Pa*s, preferably up to 1 Pa*s, particularly preferably up to 1000 Pa*s.

It should be mentioned at this point that in the exemplary embodiment shown it is provided that the contact surface 17 of the lever 16 is permanently in contact with the contact surface 34 of the plunger head 33, by virtue of the fact that a plunger spring 35 presses the plunger head 33 against the lever 16 from below. In principle, it would also be possible, however, that a distance exists between plunger 31 and lever 16 in an initial or resting position of the plunger spring 35, so that when pivoted downwards the lever 16 first freely travels along a specific path section, thereby gaining speed and then striking the plunger 31 or its contact surface 34 with a high impulse, in order to increase the discharge pulse which the plunger 31 in turn applies to the medium. In order to ensure an almost constant pre-tensioning of the drive system (lever-actuator unit-movement system), the lever 16, at the end at which it comes into contact with the plunger 31, is pushed upwards by an actuator spring 19.

In the lower region, the action chamber 13 comprises a discharge opening 22 for a coolant, e.g. compressed ambient air or pressurized air. The discharge opening 22 passes through a chamber wall of the action chamber 13 or through the housing block 11, in particular directly, i.e. without branching, from an interior of the action chamber 13 to an outside of the metering system 1. In this case, the discharge opening 22 likewise corresponds to the discharge opening 22 of the action chamber 13, as well as the discharge opening 22 of the metering system 1.

The discharge opening 22, in conjunction with a corresponding feed opening 21 of the metering system 1 for the coolant in the upper region of the actuator chamber 12, can be used to ensure that coolant flows through the actuator chamber 12 and the action chamber 13 continuously. Preferably, mechanical abrasion debris from the actuator chamber 12 or action chamber 13 can be removed from the metering system 1 through the discharge opening 22 by means of the coolant flow. The feed opening 21 of the action chamber 12 likewise corresponds here to the feed opening 21 of the metering system 1. In FIG. 1, the feed opening 21 comprises an external plug-in nipple for contacting a hose for feeding compressed air into the actuator chamber 12.

A further important aspect of the coolant mentioned is the cooling of the piezo actuator encapsulated in the housing 62, or of the actuator unit 60. This is explained in more detail elsewhere.

As mentioned above, the fluidic assembly 30 here is connected to the actuator assembly 10 by means of a fixing screw 23. The plunger 31 is mounted by means of the plunger spring 35 on a plunger mounting 37, to the bottom of which a plunger seal 36 is connected. The plunger spring 35 pushes the plunger head 33 away from the plunger mounting 37 upwards in an axial direction. At the same time, a plunger tip 32 is also pushed away from a sealing seat 43 of the nozzle 40. In other words, without external pressure from above on the contact surface 34 of the plunger head 31, in the rest position of the plunger spring 35 the plunger tip 32 is located at a distance from the sealing seat 43 of the nozzle 40. Thus, in the rest state (unexpanded state) of the piezo actuator, a nozzle opening 41 is also free or unsealed.

The metering material is fed to the nozzle 40 via a nozzle chamber 42 and a feed channel 44 which is connected thereto. The feed channel 44 is connected to a medium reservoir 46 by means of a reservoir interface 45. Furthermore, the fluidic assembly may also comprise a range of additional components which are typically used in metering systems of this type, such as a frame part 47, a heating device 48 with heating connection cables 49 etc., to name but a few. Since the basic structure of metering systems is known, for the sake of clarity, the components shown here are mainly those which relate to the invention, at least indirectly.

FIG. 2 shows a cross-section through a part of a metering system according to another embodiment of the invention. The housing block 11 comprises the actuator chamber 12, in the interior of which the actuator unit 60 is arranged (shown here only as an example). Between the housing 62 and an inner side 80 of the chamber wall 79, which forms the interior of the actuator chamber 12, a narrow gap remains which here surrounds the housing 62 in a circular manner and enables the coolant flow. To feed the coolant into the flow region, the actuator chamber 12 is connected to an inlet channel 26 by means of a feed-in opening 24, here in the form of an opening 24 through the chamber wall 79. The inlet channel 26 runs essentially parallel to the actuator chamber 12 through the housing block 11 and has a number of channels that branch off predominantly at right angles, wherein only one feed opening 24 or discharge opening 25 is visible here due to the way in which it is displayed. Starting from the feed opening 24, by virtue of its design the coolant flows (forcibly) to an assigned discharge opening 25 in such a way that the housing 62 is immersed in the coolant on both sides. The discharge opening 25 is connected to an outlet channel 27 for discharging the coolant from the actuator chamber 12 or from the metering system 1.

Due to the bellows-like design of the housing, at least in the area of the housing casing (see FIG. 6), it can be ensured that the coolant flow is directed (targeted) from a respective feed opening 24 to a discharge opening 25 that interacts with it. For this purpose, the coolant can flow along a respective (horizontal) indentation of the bellows-shaped or corrugated housing 62, wherein the coolant flow upwards or downwards is limited by the respective adjoining convex regions. This is particularly clear in FIG. 3.

In FIG. 3, the main purpose is to illustrate the mode of action of the cooling device of the metering system, wherein other components of the metering system are not shown for the sake of clarity.

The inlet channel 26 originates in a single feed opening 21 of the metering system and then branches along the actuator chamber 12 into a number of feed openings 24 of the actuator chamber 12. To regulate the coolant influx into the inlet channel 26 or the actuator chamber 12, a coolant feed device 28, in this case a pump 28, is connected between a coolant feed 84 and the feed opening 21. The pump 28 can be controlled by the control unit 50 by means of a control connection 29. As an alternative to the embodiment shown here, the coolant feed device 28 or the pump 28 could also be located outside the housing 11 of the metering system. As part of the temperature management of the piezo actuator, temperature measurements from the housing 62 are fed to the control unit 50 via a temperature sensor connecting cable 86. As a function of one (or more) determined temperature values (actual values), the control unit 50 can control the pump 28 in such a way that a setpoint value of the temperature in a certain region of the housing 62, e.g. in the actuator core, is not exceeded. For this purpose, the quantity of e.g. coolant supplied to the actuator chamber 12 can be adjusted by the pump 28 in line with demand.

As an alternative to the use of a separate pump for the coolant, e.g. to blow room air into the actuator chamber 12, compressed air from a reservoir of an already existing compressed air system which is also used for other purposes can also be used to cool the actuator unit 60. In this compressed air system, room air is compressed in the usual way and stored in an existing reservoir or store (not shown) until it is fed into the actuator chamber 12. The flow rate of the compressed air into the actuator chamber 12 can be regulated by means of a proportional valve (not shown), for example, wherein the proportional valve, as explained above for the pump, can be controlled by the control unit 50 as a function of at least one temperature value.

The inlet channel 26 runs directly along an outer side 81 of the chamber wall 79 facing away from the inner side 80 of the chamber wall 79. In other words, the inlet channel 26 is bounded or formed at least partially, i.e. toward the actuator chamber 12, by the outside 81 of the chamber wall 79.

The actuator chamber 12 itself is formed inside the housing block 11 by the inside 80 of the chamber wall 79. Due to the bellows-shaped, corrugated design of the housing 62 of the piezo actuator, the housing 62 is directly adjacent to the inner side 80 of the chamber wall 79 in the region of a respective convexity 82 or bulge 82. Between the respective convex sections 82, essentially horizontal indentations 83 or grooves 83 are arranged periodically. The at least partially bellows-shaped design of the housing 62 in the region of the housing casing 74 (see FIG. 6) corresponds to a preferred design of the actuator unit 60, as explained below.

The actuator unit 60 is arranged in the actuator chamber 12 in such a way that a feed opening 24 and a co-operating discharge opening 25 of the actuator chamber 12 are each arranged in a horizontal plane with a single channel 83 of the housing 62. Thus, the gaseous or liquid coolant flowing in through a respective feed opening 24 is guided along a respective channel 83, which is bounded vertically by the adjacent convex sections 82, essentially horizontally from the feed opening 24 to the associated discharge opening 25, flowing around the housing 62 as it does so to provide heat dissipation.

From the respective discharge opening 25, the coolant enters the outlet channel 27, which, analogously to the inlet channel 26, comprises or combines a number of discharge openings 25 of the actuator chamber 12 and finally opens into a single discharge opening 22 of the metering system, which in turn is coupled to a coolant discharge 85.

FIG. 4 shows a detailed longitudinal section through an exemplary embodiment of an actuator unit of the metering system according to the invention. The piezo actuator 61 is hermetically enclosed in a housing 62. The housing 62 comprises a housing base 66, a housing casing 74 fixedly connected thereto, and a housing lid 67 which forms the upper termination. The piezo actuator 61 rests directly on the housing base 66 with an inactive (foot) region 73, wherein the opposite end region 73 of the piezo actuator 61 has direct contact with the housing lid 67. The piezo actuator 61 is fixedly connected to the housing lid 67, e.g. glued.

The housing lid 67 comprises four glass feed-throughs 69, by means of which the contact pins 65 are routed out of the interior of the housing 62 to the outside of the housing 62 in a hermetically sealed and electrically insulated manner. One contact pin 65 in each case is connected, e.g. soldered, on one side of the piezo actuator 61 to an external electrode 70 of the piezo actuator 61. The two outer electrodes 70 extend along the longitudinal extension of the piezo actuator 61 between the two inactive head and foot regions 73 on the outer side or surface 77 of the piezo actuator 61. This is particularly clear in FIG. 5.

The two external electrodes 70 connect the internal electrodes 71 arranged in the piezo actuator 61 and alternately routed to the surface and connect them to form two groups electrically connected in parallel (see FIG. 4). The two connection pins 65 therefore form the two connection terminals of the piezoceramic actuator 61.

Two additional contact pins 65 are used for contacting a number of temperature sensors 78 in the housing. Each of the temperature sensors 78 is connected to the two contact pins 65 via a respective temperature sensor connection cable (not shown). For the contacting, a (constant) measuring current is fed to the individual temperature sensors 78 via one of the two contact pins 65 and a respective temperature sensor connection cable connected thereto. A measurement signal (such as a voltage change) from each temperature sensor 78 is transmitted via a respective temperature sensor connection cable (not shown) to another (fourth) connection pin 65. To transmit the measurement signals (temperature readings) of a plurality of temperature sensors 78 to the control unit, the individual sensor signals can, as explained above, be applied to only one contact pin 65 and suitably modulated, provided that the temperature sensors 78 are bus-compatible IC temperature sensors.

Alternatively, it would be possible to contact each temperature sensor 78 in the housing using two separate contact pins 65 (not shown here), i.e. ones which are assigned only to the respective temperature sensor 78. It is preferable to consider the two alternatives mentioned on a case-by-case basis, because the separate contacting of each individual temperature sensor 78 using dedicated contact pins 65 reduces the electrical complexity of the modulation, but at the same time also implies increased requirements on the manufacture of the actuator unit 60.

In FIG. 4, three temperature sensors 78 are arranged in measurement contact with the inner wall of the housing 62 or with the housing casing 74 (shown here on the left). Furthermore, on the surface 77 of the piezo actuator 61, three additional temperature sensors 78 are arranged in such a way that a temperature sensor 78 of the inner wall or of the actuator surface 77 is located on a common imaginary, substantially horizontal line, as is apparent in the longitudinal section.

In addition to the housing 62, the piezo actuator 61 and the connecting pins 65, the actuator unit 60 also comprises the atmosphere arranged in the housing 62. In the exemplary embodiment shown here, the atmosphere consists of a liquid and a solid filling medium 75, and an expansion zone 76. The expansion zone 76 is shown here as gas bubble 76 or gas-filled region 76.

FIG. 5 shows a detailed longitudinal section through an exemplary embodiment of an actuator unit 60 of the metering system. In contrast to FIG. 4, here temperature sensors 78 are also located both at the inactive foot region 73 and in the inactive head region 73 of the piezo actuator 61, in the latter case in direct proximity to the feed-through 69. The expansion zone 76 here is enclosed in the housing 62 in the manner of an "air balloon", i.e. materially separated from the filling medium 75. For reasons of clarity, FIG. 5 shows only one contact pin 65.

In the housing 62, a strain gauge 87 is also arranged on the outer side of the piezo actuator 61. Here, the strain gauge 87 extends essentially along the entire longitudinal extension of the encapsulated piezo actuator 61, i.e. between a foot region 73 and a head region 73. The corresponding measurements (sensor signals) of the strain gauge 87 can be transferred to the control unit of the metering system by means of contact pins 65, in a similar way as already explained for the temperature sensors 78. A further strain gauge 87 is arranged on the outer side of the housing 62, the strain gauge 87 there extending between the housing base 66 and the housing lid 67 so that it can detect a total deflection (including a temperature-related length change) of the actuator unit 60 or the encapsulated piezo actuator 61.

FIG. 6 shows a lateral external perspective view of another embodiment of an actuator unit 60 for a metering system according to the invention. The actuator unit 60 corresponds essentially to that of FIG. 1, except the contact pins 65 and the feed-throughs 69 are arranged differently in the respective actuator units 60. FIG. 6 clearly shows the P06835W0 34 bellows-like design of the housing casing 74, which comprises a periodic sequence of convex sections 82 and indentations 83 or grooves 83. In the exemplary embodiment shown here, the preferred heat dissipation zone 68 of the actuator unit 60 essentially corresponds to or is formed by the entire bellows-shaped region of the housing casing 74. The heat dissipation zone 74 is designed in such a way that, within the confines of the temperature management of the piezo actuator, the most efficient heat removal from the heat dissipation zone 74 is achieved by means of the cooling device. The housing 62 has a predominantly circular diameter D, which is preferably larger than a corresponding diameter of the encapsulated piezo actuator 61.

In conclusion, it will be pointed out once again that the metering systems described above are merely exemplary embodiments which can be modified in a variety of ways by the person skilled in the art without departing from the scope of the invention. For example, the piezo actuator could be arranged in the housing without a defined "protective" atmosphere. In addition to or as an alternative to the previously explained components, the metering system may also comprise further features or assemblies that are usually used in metering systems of the described type. Furthermore, the use of the indefinite article "a" or "an" does not exclude the possibility that the features concerned may also be present more than once.

REFERENCE LIST 1 metering system
10 actuator assembly
11 housing block
12 actuator chamber
13 action chamber
14 movement mechanism
15 opening
16 lever
17 lever contact surface
18 lever mounting
19 actuator spring
20 pressure piece
21 feed opening metering system
22 metering system discharge opening
23 fixing screw
24 actuator chamber feed opening
25 actuator chamber discharge opening
26 inlet channel
27 outlet channel
28 pump
29 pump control connection
30 fluidic assembly
31 plunger
32 plunger tip
33 plunger head
34 plunger contact surface
35 plunger spring
36 plunger seal
37 plunger mounting
40 nozzle
41 nozzle opening
42 nozzle chamber 43 sealing seat
44 feed channel
45 reservoir interface
46 medium reservoir
47 frame part
48 heating device
49 heating connection cable
50 control unit
51 control cable
60 actuator unit
61 piezoceramic actuator
62 housing
64 actuator unit control connections
65 contact pin
66 housing base
67 housing lid
68 heat dissipation zone
69 glass feed-through
70 external electrode
71 internal electrode
72 piezoactive material
73 inactive region
74 housing casing
75 filling medium
76 expansion zone
77 actuator surface
78 temperature sensor
79 chamber wall
80 inner side of chamber wall
81 outer side of chamber wall
82 housing bellows convex section
83 housing bellows concave section
84 coolant feed
85 coolant discharge
86 temperature sensor connection cable
87 strain gauge
D diameter
K tilt axis
R discharge direction

The invention claimed is:

1. A metering system for a metering substance, comprising
 a nozzle,
 a feed channel for a metering substance,
 a discharge element, and
 a piezo actuator coupled to the discharge element and/or the nozzle, wherein
 the piezo actuator is hermetically encapsulated in a housing by being arranged entirely between a housing base and a housing lid along an entire longitudinal extension of the piezo actuator.

2. The metering system according to claim 1, wherein the housing is designed to be vibration fatigue-resistant.

3. The metering system according to claim 1, wherein
 at least one temperature sensor is arranged inside the housing and/or on an outer side of the housing.

4. The metering system according to claim 3, wherein
 at least one temperature sensor is arranged on an outer side of the piezo actuator and/or inside the piezo actuator.

5. The metering system according to claim 3, wherein at least one temperature sensor is located on an inner wall of the housing.

6. The metering system according to claim 1, wherein
 at least one strain gauge is arranged inside the housing and/or on an outer side of the housing.

7. The metering system according to claim 1, wherein
 the housing comprises at least one feed-through for a number of electrical conductors.

8. The metering system according to claim 1, wherein
 a thermally conducting medium and/or a medium for moisture suppression are located in the housing.

9. The metering system according to claim 1, wherein
 a pressure compensation zone is located in the housing.

10. The metering system according to claim 1, wherein
 the housing comprises a heat dissipation zone.

11. The metering system according to claim 10, further comprising
 a cooling device that uses a coolant which comprises a gaseous and/or liquid medium.

12. The metering system according to claim 10, further comprising
 a cooling device that is designed in such a way that mechanical abrasion debris is removed from an actuator chamber of the metering system by the coolant.

13. A method of using the piezoceramic actuator hermetically encapsulated in the metering system for metering the metering substance according to claim 1.

14. A method for operating the metering system for metering the metering substance according to claim 1, the metering system including the piezo actuator hermetically encapsulated in the housing.

15. A method for producing a metering system for metering a metering substance, the metering system including a piezo actuator, wherein
 the piezo actuator is hermetically encapsulated in a housing, and
 the housing of the piezo actuator is arranged in a housing of the metering system.

16. The metering system according to claim 10, wherein the heat dissipation zone is coupled to a cooling device of the metering system.

17. The method for producing the metering system for metering a metering substance according to claim 15, wherein
 the piezo actuator is hermetically encapsulated in the housing by being arranged entirely between a housing base and a housing lid along an entire longitudinal extension of the piezo actuator.

18. The method for operating the metering system for metering the metering substance according to claim 14, further comprising
 regulating, as a function of at least one operating parameter of the encapsulated piezo actuator, the operation of the metering system.

* * * * *